United States Patent [19]
Ladner et al.

[11] Patent Number: 5,251,150
[45] Date of Patent: Oct. 5, 1993

[54] SUB-MODULAR DEVELOPMENT SYSTEM FOR MODULAR COMPUTER-BASED INSTRUMENTS

[75] Inventors: Desmond C. Ladner, Camas; Spass Stoiantschewsky, Vancouver, both of Wash.

[73] Assignee: Tektronix, Inc., Wilsonville, Oreg.

[21] Appl. No.: 297,529

[22] Filed: Jan. 13, 1989

[51] Int. Cl.$^5$ ............................................. G06F 15/20
[52] U.S. Cl. ................................. 364/550; 364/579; 364/511.01; 371/15.1
[58] Field of Search ................... 364/550, 551.01, 131, 364/483, 709.1, 221.7, 579, 578; 371/15.1, 27; 324/73 R, 73.1, 158 R

[56] References Cited

U.S. PATENT DOCUMENTS

| | | | |
|---|---|---|---|
| 3,854,125 | 12/1974 | Ehling et al. | 371/15.1 |
| 4,413,319 | 11/1983 | Schultz et al. | 364/200 |
| 4,424,559 | 1/1984 | Lorincz et al. | 364/131 |
| 4,590,550 | 5/1986 | Eilert et al. | 364/200 |
| 4,683,550 | 7/1987 | Jindrick et al. | 364/709.1 |
| 4,707,834 | 11/1987 | Frisch et al. | 371/15.1 |
| 4,710,893 | 12/1987 | McCutcheon et al. | 364/900 |
| 4,760,330 | 7/1988 | Lias | 371/15.1 |
| 4,849,893 | 7/1989 | Page et al. | 364/131 |
| 4,858,101 | 8/1989 | Stewart et al. | 364/131 |
| 4,918,691 | 4/1990 | Chall | 371/15.1 |

OTHER PUBLICATIONS

Korn; "A Distributed Computer System for Laboratory Automation"; Computer Design Jun. 1977.

Primary Examiner—Jack B. Harvey
Assistant Examiner—Ellis B. Ramirez
Attorney, Agent, or Firm—Daniel J. Bedell; Francis I. Gray

[57] ABSTRACT

An instrument module development system for a computer-based instrument system, which system includes a chassis with slots for receiving various instrument modules and a system bus with a conventional computer bus for conveying commands and data between a host computer and the instrument modules and with additional lines for conveying control signals and data between the various instrument modules, has a module housing for insertion into one of the chassis slots, a development board mounted therein, and a serial input/output (SI/O) board. The development board includes a conventional computer processor, ROM, and computer bus interface circuits all interconnected by an intramodule bus. Firmware in the development board ROM enables the module to communicate with the host computer through the system bus. User developed applications firmware in the development board ROM enables the processor to communicate with and control a user provided instrument board via the intramodule bus. The SI/O board is provided with a RAM, a ROM and a serial port accessible through the intramodule bus on the development board. A user operating a computer connected to the serial port downloads, tests and debugs an application routine in the SI/O board RAM. When the user has perfected the application routine, the user may burn the routine into a development board ROM and disconnect the SI/O board from the development board.

13 Claims, 5 Drawing Sheets

SUB-MODULAR DEVELOPMENT SYSTEM FOR MODULAR COMPUTER-BASED INSTRUMENTS

BACKGROUND OF THE INVENTION

This invention relates in general to electronic instrumentation systems wherein computer-based instrument modules installed in a chassis communicate with a host computer through backplane wiring on the chassis, and more particularly to a development system for such instrument modules.

When an electronic equipment test, computation or control function involves the use of more than one instrument, difficulties arise in coordinating their operation. U.S. Pat. No. 4,707,834, entitled "Computer-based Instrument System" issued Nov. 17, 1987 to Frisch et al, describes a system for interconnecting several instruments to a host computer. Cards installed in slots of an equipment chassis form various instruments that communicate with one another and with an external host computer through a system bus on the equipment chassis. Each instrument board suitably includes a microcomputer that communicates with the host computer via one of the busses and controls instrument operation in response to instructions from the host computer. Other backplane busses interconnecting the instrument boards eliminate the need for custom wiring by conveying control and data signals between the various instruments. A similar system is under consideration by the Institute of Electrical and Electronics Engineers as standard for an open architecture modular instrument system called the "VXIbus", an extension of IEEE standard 1014 computer bus, also known as the "VMEbus".

While the VXIbus system helps an instrument user to automate tests involving several instruments, it complicates the job of an instrument maker. The instrument maker not only must design and build an instrument to carry out some particular function, but must also design the physical layout of the instrument to fit within one or more VXIbus slots and must develop computer-based hardware and firmware appropriately interfacing the instrument to the VXIbus. The time and cost of developing the interface circuits and firmware controlling it can be high, particularly to an instrument maker not having extensive experience in computer hardware and firmware design.

SUMMARY OF THE INVENTION

The present invention relates to a modular computer-based instrument system including a chassis with slots for receiving various instrument modules. A system bus (in the preferred embodiment, a VXIbus) connected to the slots includes a conventional computer bus (in the preferred embodiment, a VMEbus) for conveying commands and data between a host computer and the instrument modules installed in the slots. The system bus also includes additional lines not directly accessed by the host computer. These additional lines convey control and timing signals and data between the various instrument modules. The present invention relates in particular to an apparatus that simplifies development of instrument modules.

In accordance with the present invention, an instrument development system includes a module housing for insertion into a chassis slot. A "development" board mounted in the module housing comprises a conventional computer processor and random access and read only memories (RAMS and ROMs) interconnected by a local computer bus (herein called the "intramodule bus"). The development board also includes a circuit interfacing the intramodule bus to the VMEbus portion of the system bus accessed by the host computer. The bus interface circuit permits the computer processor on the development board to communicate with the host computer via the VMEbus.

In accordance with another aspect of the invention, the module housing includes space for mounting a user provided "instrument" board including necessary hardware for carrying out operations specific to the instrument module in response to commands from the computer processor on the development board. The instrument board includes a connector accessing the intramodule bus on the development board so that the computer processor may communicate with the instrument board through the intramodule bus. To communicate with other instruments installed in the chassis, the instrument board may directly access appropriate portions of the system bus through a connector on the module housing.

In accordance with a further aspect of the invention, the computer processor on the development board operates under control of firmware including a computer operating system and routines for communicating with the host computer via the bus interface circuit. These portions of the firmware are similar regardless of the nature of the instrument module. The remaining portions of the firmware in the ROMs consist of one or more user-supplied "applications" routines for controlling and communicating with the instrument board, and these routines are specific to the particular instrument. Thus, to develop an instrument, an instrument module designer need only design the instrument board and the appropriate applications firmware routines for the computer processor on the development board.

In accordance with yet another aspect of the invention, the development system includes a serial input/output ("SI/O") board including additional RAM and ROMS, a pair of serial ports, and a connector for connecting the RAM, ROMS, and serial ports to the intramodule bus on the development board. The SI/O board ROM firmware includes drivers for the serial ports and a debugger routine.

In accordance with still another aspect of the invention, a startup routine in a development board ROM tells the computer processor to determine if the SI/O board is installed. If not, the startup routine jumps to the user-provided application routine in another development board ROM. However, if the SI/O board is connected to the development board, the startup routine in the development board jumps to a startup routine in the SI/O board ROMs which initializes the SI/O board and then invokes the debugger routine, also in an SI/O ROM.

The debugger routine enables an instrument module designer writing code on an external computer or terminal connected to the serial ports to download, test and debug an application routine in the SI/O board RAM. Once the instrument module designer has perfected the application routine, the designer can burn the routine into a development board ROM and disconnect the SI/O board from the development board if not otherwise needed by the instrument for its serial ports.

It is accordingly an object of the invention to provide a system that facilitates development of hardware and firmware for instrument modules suitable for use in a computer based instrument system.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

Figure 1:
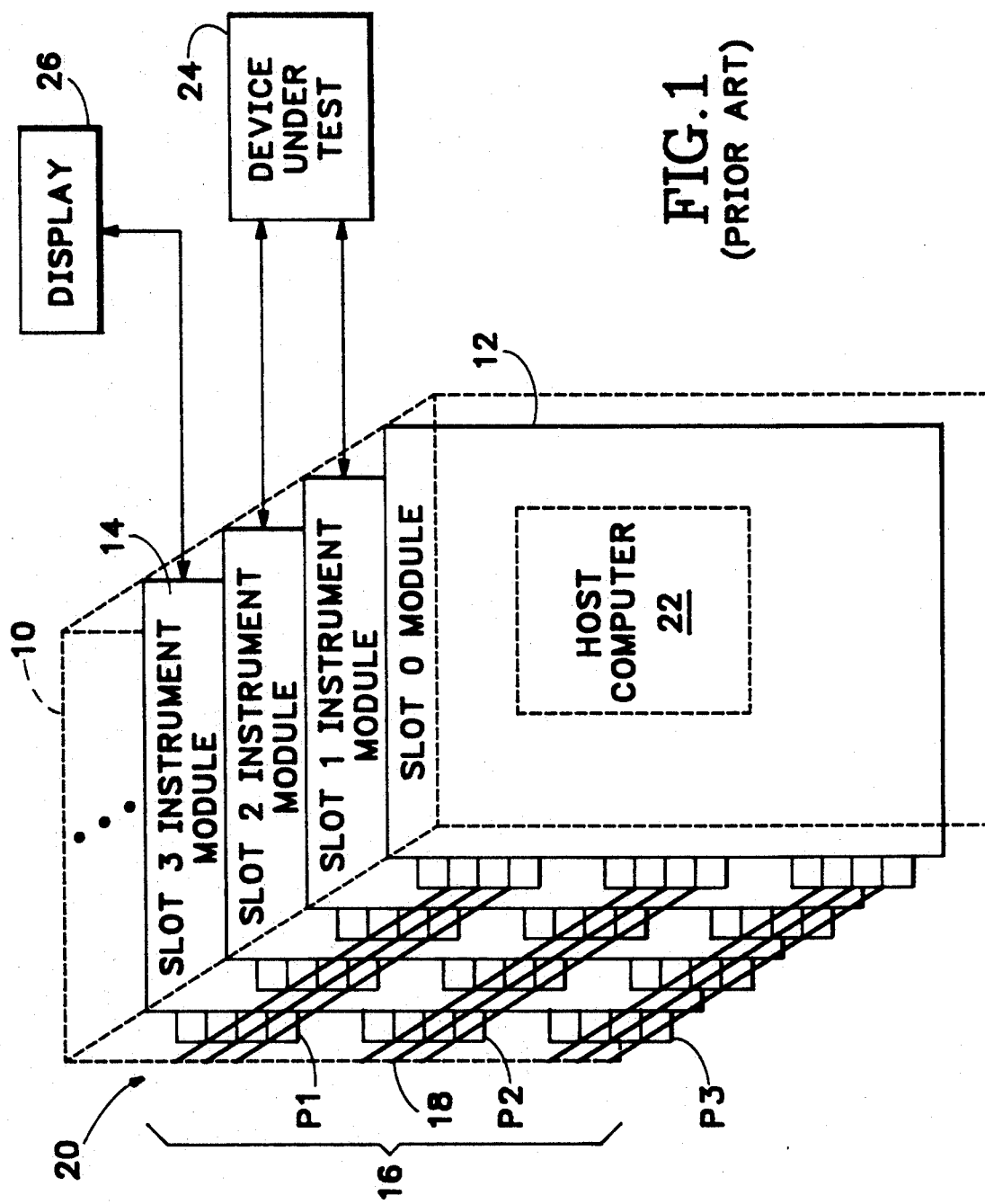
FIG. 1 is a simplified diagram of the physical layout of a typical subsystem for VXIbus instrument system of the prior art.

The "VXIbus" specification defines an open system architecture for modular computer-based automatic test equipment that is an extension of the IEEE standard 1014 computer bus (the "VMEbus"). A VXIbus system consists of one or more subsystems, each subsystem including a chassis, a timing module and up to twelve instrument modules mounted within slots of the chassis. FIG. 1 is a simplified diagram of the physical layout of a typical VXIbus subsystem including a chassis 10, a timing and resource manager module 12 (the "slot 0" module), and twelve instrument modules 14 (the slot 1-12 modules). While instrument modules may carry out such traditional analog or digital instrumentation functions as signal generation and processing, instrument modules may also process and store data, control graphics displays, generate machine control signals and carry out many other functions.

The VXIbus 16 runs along the back of chassis 10, and the various modules 12 and 14 each access the VXIbus through a set of 96-pin, three-row connectors P1-P3. The P1 connector connects the module to a portion of the VXIbus identical to a 16-bit version of the VMEbus. A center row of the P2 connector accesses additional data and address lines 18 of the VXIbus, extending the standard 16-bit VMEbus on connector P1 to a 32-bit VMEbus. The outer rows of the P2 connector and the P3 connector access VXIbus lines conveying various power, control, timing, digital and analog data signals between the timing module 12 and the instrument modules 14. The VMEbus 20 part of the VXIbus 16 links each subsystem to a host computer 22 on module 12 so that the host computer can communicate with each module using standard VMEbus protocol.

Standard instrument modules for the VXIbus come in four sizes. An "A" size module (3.9"×6.3") includes only the P1 connector and therefore accesses only the 16-bit version of the VMEbus. A "B" size module (9.2"×6.3"), a "C" size module (9.2"×13.4"), and a "D" size module (14.4"×13.4") each include both the P1 and P2 connectors and may access the full 32-bit VMEbus. The B, C and D size modules may also communicate with the slot 0 timing module and with other B, C and D size modules through the additional lines on the outer pins of the P2 connector. A D size module also includes the P3 connector enabling it to make use of additional VXIbus lines for communicating with other D size modules. In FIG. 1, all modules shown are D size, though in other embodiments a chassis may accommodate modules of varying sizes. The front edges of instrument modules 14 may include connectors for input or output lines for communicating with a device under test 24, a display device 26, or other external equipment.

Before initiating a test, host computer 22 transmits instructions to the various modules via the VMEbus 20 for appropriately configuring the modules for the test. For example, one instrument module 14 may be a waveform generator for supplying a test signal to the device under test 24. The host computer 22 may adjust various parameters of the generated waveform such as shape and frequency. Another instrument module 14 may be a digitizer for digitizing an output signal produced by the device under test, and the host computer may adjust the sampling rate of the digitizer.

Control, triggering and timing signals conveyed on various lines of the VXIbus between the slot 0 timing module 12 and the instrument modules 14 coordinate the sequence of operations of the various slot 1-12 instrument modules 14 in performing a test. The host computer also transmits instructions to the timing module 12 and to the relevant instrument modules 14 indicating how each module is to respond to control, triggering and timing signals conveyed on the VXIbus. For example, the host computer may instruct a digitizer module to transmit a trigger signal to the timing module when it has acquired a predetermined number of data values. The timing module may respond to the trigger signal by transmitting signals on the VXIbus coordinating transfer of the data from the digitizer module to a module generating a display of the data on device 26.

To design an instrument module compatible with the VXIbus system, an instrument maker must conform the physical layout of the instrument to one of the standard module sizes and must develop computer-based hardware and firmware for the instrument module appropriately interfacing the instrument to the VXIbus. The time and cost of developing an interface circuit and firmware controlling it can be high, particularly to an instrument maker not having extensive experience in computer hardware and firmware design. The present invention simplifies development of instrument modules by providing the portion of the hardware and firmware for the module that interfaces the instrument to the VMEbus. The present invention also provides additional hardware and firmware that helps the designer to develop, test and debug firmware for the instrument module.

Figure 2:
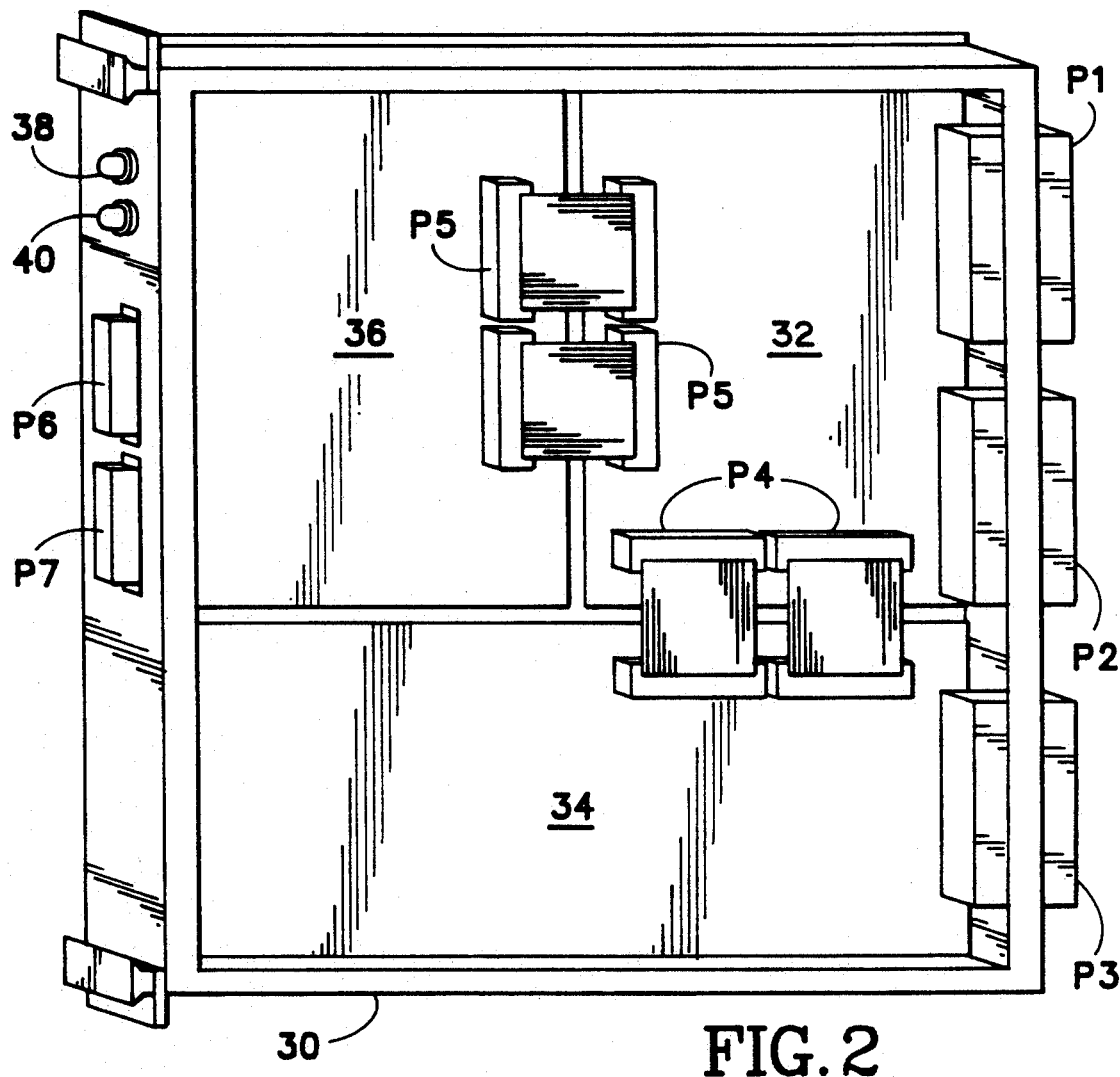
FIG. 2 is a side view of an instrument module development system in accordance with the present invention.

Referring to FIG. 2, a preferred embodiment of the instrument development system includes a D-sized module housing 30 for insertion within a D-sized slot of the VXIbus. A "development" board 32 mounted in housing 30 includes a computer-based system for communicating with the host computer through the VMEbus portion of the VXIbus. Standard P1 and P2 connectors extend from development board 32 through the rear of housing 30. The development board 32 forms an integral part of an instrument module and, except for firmware stored in ROMs on the development board, the user normally need not modify the development board in any way when developing any particular instrument module.

The D-sized module housing 30 includes space for mounting a user-supplied "instrument" board 34. Instrument board 34 includes hardware that is specific to the particular instrument. Regardless of its function, an instrument board 34 should include a pair of ribbon cable connectors P4 for accessing an "intramodule" computer bus on the development board 32 permitting a computer processor on the development board to communicate with the instrument board. To communicate with instrument boards of other modules installed in the chassis, the instrument board 34 may directly access appropriate lines of the VXIbus through a P3 connector extending through the module housing. If needed, the instrument board 34 may also access various lines of the VXIbus available through the P2 connector through user-provided jumpers (not shown) extending between the P2 connector and the instrument board.

The development system also includes a serial input-/output ("SI/O") board 36 connected to the intramodule bus though a pair of ribbon cable connectors P5. The SI/O board 36 contains a pair of RS232 standard serial ports permitting the computer processor on development board 32 to communicate with external equipment such as a terminal or a remote computer through connectors P6 and P7. SI/O board 36 also includes a pair of pushbuttons 38 and 40 that transmit interrupts to the computer processor on the development board 32 for initiating interrupt routines. The SI/O board may, but need not be, mounted in housing 30. When mounted in housing 30, connectors P6 and P7 and pushbuttons 38 and 40 extend through the front of housing 30 as illustrated in FIG. 2. As discussed in detail hereinbelow, the SI/O board provides a user operating a remote computer or terminal with access to the intramodule bus via the serial ports during the instrument development process for loading, running and debugging applications software. The SI/O board may also form a part of a developed instrument module when the instrument module needs the serial ports and other resources on the SI/O board. If the completed instrument module does not require SI/O board resources, the instrument board 34 may extend into the area shown in FIG. 2 as occupied by the SI/O board.

Figure 3:
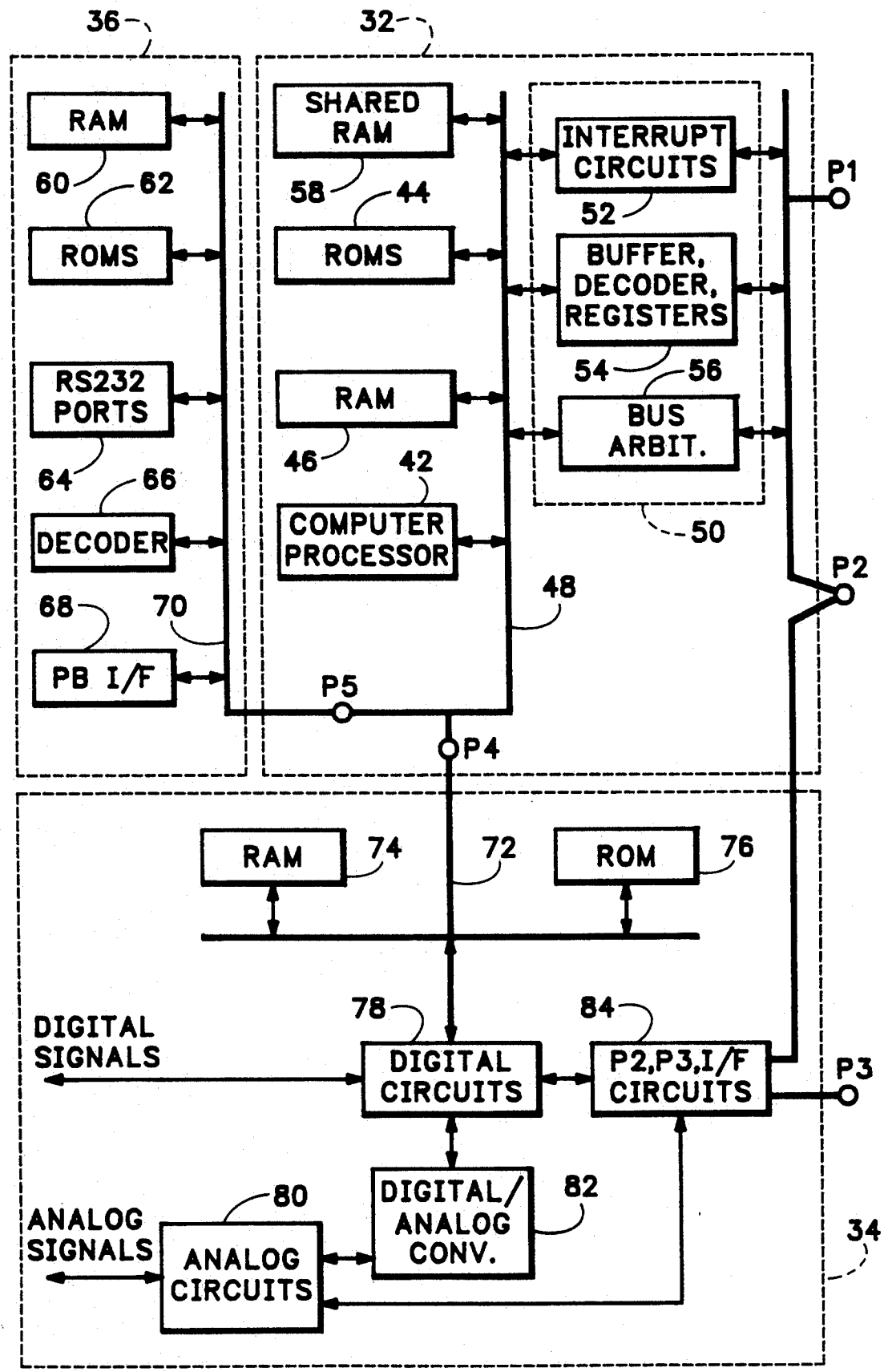
FIG. 3 is a block diagram of the instrument module development system of FIG. 2.

Referring to FIG. 3, the development board 32 includes a computer processor 42, read only memories (ROMS) 44, and random access memory (RAM) 46, interconnected by the intramodule bus 48. Interface circuits 50, connected between intramodule bus 48 and the P1 and P2 connectors, include conventional interrupt circuits 52, buffering, decoding, and register circuits 54 and bus arbitration circuits 56. Interface circuits 50 permit computer processor 42 to communicate with the host computer via the VMEbus portion of the VXIbus. The buffering, decoding, and register circuits 54 permit the host computer to download program instructions or data into a "shared" RAM 58, also accessible by computer processor 42 through the intramodule bus 48.

Computer processor 42, normally operating under control of firmware in ROMs 44, uses RAM 46 for temporary data storage. The firmware ROMs 44 include a conventional computer operating system, conventional routines for carrying out various operations on system start up or reset and for communicating with the host computer via the bus interface circuit 50. These portions of the firmware in ROMs 44 are similar regardless of the specific function of the instrument module under development. The remaining portions of the firmware in ROMs 44 consist of one or more user-provided "applications" routines for controlling and communicating with the instrument board 34. These routines are specific to the particular instrument. Thus, to develop an instrument module, a designer need only design the instrument board 34 and the appropriate applications firmware routines for the computer processor 42 on the development board 32.

FIG. 3 illustrates various types of hardware that may (though not necessarily) be included on an instrument board 34. An instrument board 34 should always include an extension 72 of the intramodule bus 48 and connectors P4 for connecting the extension to the intramodule bus. An instrument board may, for example, include a RAM 74 or a ROM 76 connected to bus extension 72 for providing additional memory or instructions for processor 42. An instrument board may include digital circuits 78 connected to bus extension 72 for communicating with the processor on the development board, for communicating by digital signals with an external device or for carrying out various data processing operations. An instrument board may include analog circuits 80 communicating with an external device via analog signals, along with digital/analog conversion circuits 82 interfacing analog circuits 80 with digital circuits 78. Suitable interface circuits 84 allow digital circuits 78 or analog circuits 80 to access appropriate digital or analog VXIbus lines via the P2 and P3 connectors.

The SI/O board 36 includes a RAM 60, a set of ROMs 62, a pair of RS232 serial ports 64, a decoder circuit 66, and a pushbutton interface circuit 68, all accessing an extension 70 of the intramodule bus 48. Manually operable connectors P5 couple extension 70 to intramodule bus 48 when the SI/O board is in use. During the instrument development process, a user may connect an external computer or terminal to the serial ports 64. The SI/O board firmware in ROMs 62 may include conventional drivers for the serial ports 64, routines for downloading program code into the SI/O board RAM 60 through the serial ports 64 and a conventional debugger routine.

Figure 4:
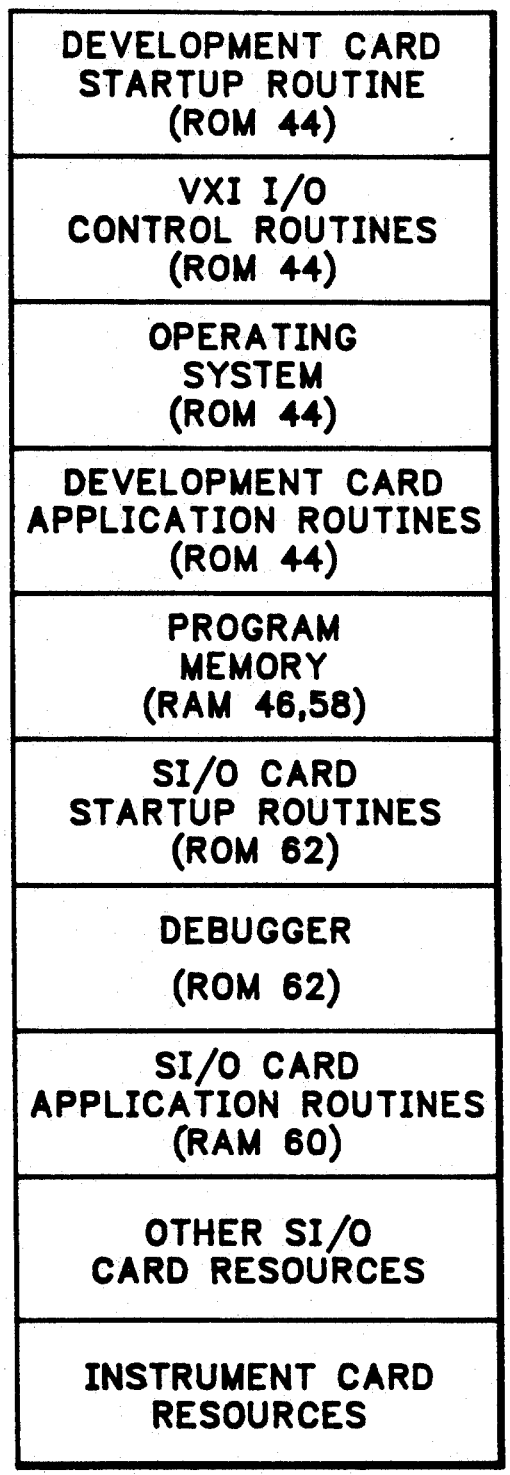
FIG. 4 is a chart of address space allocation for the intramodule bus of FIG. 3.

When a designer connects the instrument board 34 and the SI/O board 36 to the development board 32, computer processor 42 can access several resources mapped to the address space of the intramodule bus 48 including, as illustrated in FIG. 4, firmware stored in ROMs 44 and 62, temporary program data stored in RAM 46, downloaded routines or data in RAMs 58 or 60, other resources on the SI/O board 36 such as the serial ports, and various addressable resources on the instrument board 34.

Figure 5:
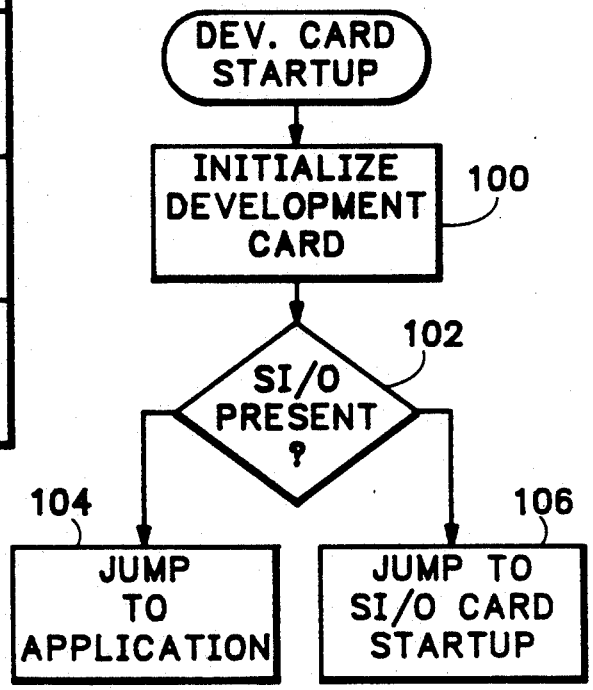
FIG. 5 is a flow chart illustrating a development board startup routine.

FIG. 5 is a flow chart illustrating a routine in a development board ROM 44 executed on system startup. At step 100, the startup routine initializes the development board by clearing registers 54 of FIG. 3 and copying a vector table from a ROM 44 into RAM 46. At step 102, the routine determines whether the SI/O board is present by placing a particular address on the intramodule bus 48. Referring to FIGS. 3 and 5, if the designer has connected the SI/O board to the development board, decoding circuit 66 in the SI/O board decodes the particular address and places a code on the intramodule bus 48 indicating the presence of the SI/O board on the intramodule bus. If the code does not appear on the intramodule bus, the startup routine jumps to an application routine stored in a development board ROM 44 (step 104, FIG. 5). However, if the code appears on the intramodule bus, the startup routine in the development board ROM jumps to another startup routine in one of the SI/O board ROMs 62 (step 106, FIG. 5).

Figure 6:
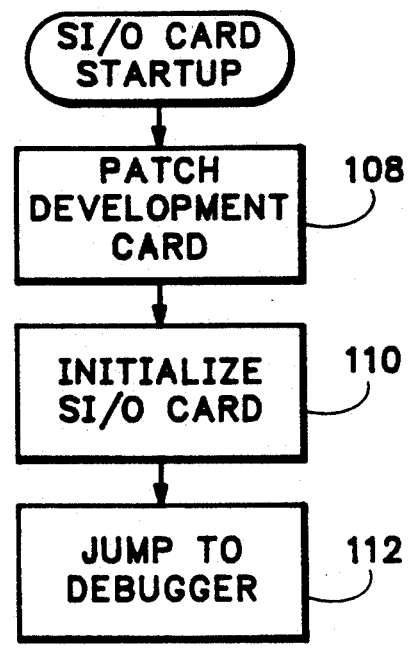
FIG. 6 is a flow chart illustrating a serial input/output board startup routine.

FIG. 6 illustrates the SI/O board startup routine. At step 108, the SI/O board startup routine patches the vector table in RAM 46 of the development board to reference interrupt routines in ROMs 62. At step 110, the startup routine initializes the serial ports 64 by storing data in registers within ports 64 controlling port operating parameters such as baud rate, parity, etc. The startup routine in the SI/O board ends at step 112 by jumping to the first address of a debugger routine in one of the SI/O board ROMs 62. The ROM 62 containing the debugger routine suitably comprises a conventional Software Components Group, Inc. model PROBE-64 System Debug/Analyzer. The debugger routine sends a prompt to a display terminal or computer connected to ports 64 and then waits for a command from the user. The debugger routine enables an instrument module designer writing code on an external terminal or computer connected to serial ports 64 to download, test and debug an application routine in the SI/O board RAM. Once the instrument module designer has perfected an application routine, the designer can add the application routine to a development board ROM and disconnect the SI/O board 36 from the module if not otherwise needed by the instrument for its serial ports. If the SI/O board 36 is to be used in the instrument, the user replaces the ROM 62 containing the debugger routine with a ROM suitably including a routine that may simply redirect program operation back to the applications routine in the development board ROMs following SI/O board initialization.

Figure 7A:
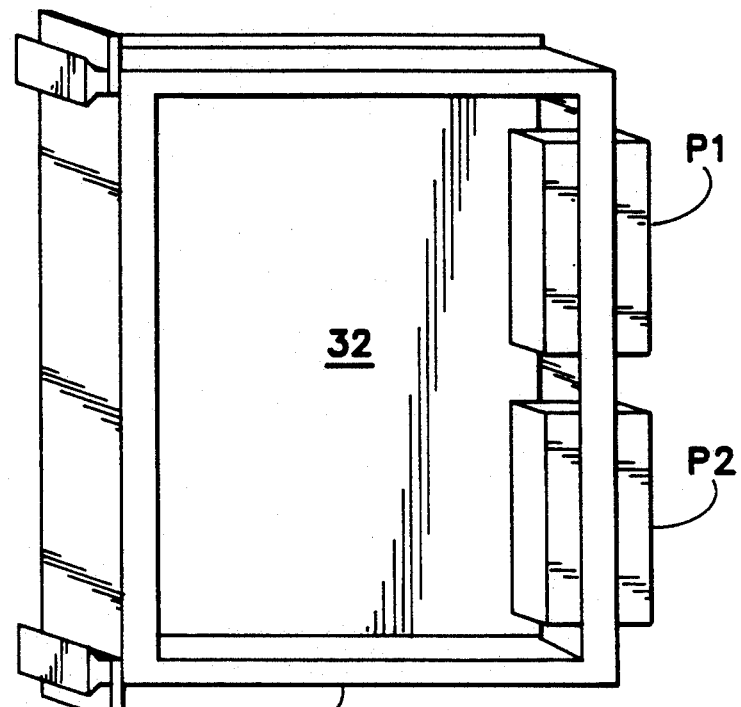
FIGS. 7A and 7B are side views of alternative embodiments of the instrument development system of the present invention.
Figure 7B:
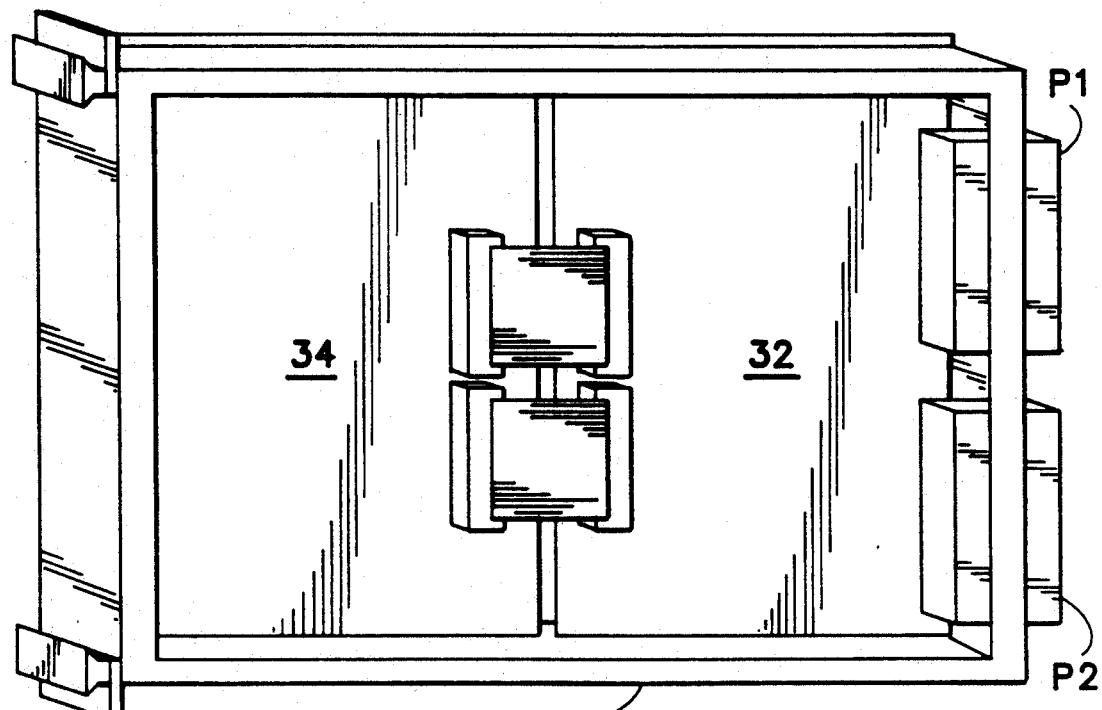

The preferred embodiment of the invention as illustrated in FIG. 2 uses a D sized module housing. However, alternative embodiments of the invention use B and C sized housings. As illustrated in FIG. 7A, the B sized module housing 30 includes internal space only for the development board 32. The B sized housing is useful when the instrument module requires only the use of the hardware resources of the development board, such as a module that merely receives, processes and transmits data via the VMEbus in accordance with user-provided applications firmware. Module housing 30 for the C sized module, as illustrated in FIG. 7B, includes space for the development board 32 for either a small instrument board 34 or the SI/O board 36. When a B, C or D sized module requires additional instrument hardware that won't fit within the housing, additional instrument boards may be attached to the housing in piggy-back fashion. However, such piggy-backed instrument boards may extend into adjacent slots in the equipment chassis.

As described hereinabove, the instrument development system of the present invention includes a module housing for insertion into a chassis slot. A development board mounted in the housing includes a conventional computer processor, RAM, ROM, and VMEbus interface circuits, all communicating through the intramodule bus. Firmware in development board ROMs enables the module to communicate with the host computer through the VMEbus portion of the VXIbus via the VMEbus interface circuits. User supplied firmware in a development board ROM enables the processor to communicate via the intramodule bus with a user-provided instrument board mounted in or on the module housing. The SI/O board enables an instrument module designer writing code on an external computer or terminal connected to SI/O board serial ports to download, test and debug application routines in the SI/O board RAM. Once the instrument module designer has perfected an application routine, the designer can burn the routine into a development board ROM and remove the SI/O board from the module chassis if not otherwise needed by the instrument for its serial ports.

While the foregoing specification has described preferred and alternative embodiments of the present invention, one skilled in the art may make many modifications to the these embodiments without departing from the invention in its broader aspects. The appended claims therefore cover all such modifications as fall within the true spirit and scope of the invention.

We claim:

1. An instrument module development system for facilitating the development of hardware and firmware for a computer-based modular instrument system of the type having a chassis with slots for receiving a plurality of instrument modules and a timing and resource manager module including a host computer, and having a system bus coupled to the slots for conveying signals to and from the instrument modules and the timing and resource management module when the modules are inserted in the slots, each instrument module comprising:

a module housing for insertion into one of said slots;

a development circuit board mounted on said module housing having an internal processor, an internal bus to which the internal processor is coupled, and means for communicating with the host computer over said system bus when said module housing is inserted into one of said slots for conveying said signals between modules;

an instrument circuit board mounted on said module housing having an internal bus and means for interfacing with the development circuit board such that the internal buses form an integral internal bus; and means for accessing the development circuit board for loading, running and debugging application specific firmware for the instrument module.

2. For a computer-based modular instrument system of the type having a chassis with slots for receiving instrument modules and a timing and resource manager module including a host computer, and having a system bus coupled to the slots for conveying data between the host computer and the instrument modules inserted in the slots, each instrument module comprising:

a module housing for insertion into one of said slots;

a first circuit board mounted in said module housing having a computer processor, first memory means for storing first and second instructions for controlling the operation of said computer processor, and a first computer bus providing said computer processor with access to said first memory means;

a second circuit board mounted in said module housing having a second computer bus similar to said first computer bus and second memory means connected to said second computer bus for storing third instructions; and connector means selectively interconnecting said first and second computer buses to form an integral computer bus enabling said computer processor to alternatively access said first, second and third instructions stored in said first and second memory means.

3. The instrument development system in accordance with claim 2 wherein said first instructions cause said computer processor to commence executing said second instructions when said connector means does not interconnect said first and second computer busses, and to alternatively commence executing said third instructions when said connector means interconnects said first and second computer busses.

4. The instrument development system in accordance with claim 2 wherein said first circuit board further comprises bus interface means connected between said first computer bus and said system bus when said module housing is inserted in one of said slots, said bus interface means enabling said computer processor and said computer to communicate via said system bus and said first computer bus.

5. The instrument development system in accordance with claim 2 wherein said second circuit board further comprises port means coupled to said second computer bus enabling said processor means to receive data from an external source and to store said data in said second memory means.

6. The instrument development system in accordance with claim 5 wherein said third instructions comprise a debugger routine enabling a user operating a terminal connected to said port means to load data including computer instructions into said second memory means and to cause said computer processor to execute said computer instructions.

7. The instrument development system in accordance with claim 2 wherein said first memory means comprises a read only memory and wherein said second memory means comprises a random access memory.

8. The instrument development system in accordance with claim 2 wherein said module housing includes space for mounting a third circuit board for carrying out an operation in response to a command from said computer processor, said instrument development system further comprising means for connecting said first computer bus on said first circuit board to said third circuit board such that said first computer bus conveys said command to said third circuit board.

9. For a computer-based modular instrument system of the type having a chassis with slots for receiving instrument modules and a timing and resource manager module including a host computer, and having a system bus connected to said slots for conveying data between the host computer and the instrument modules installed in the slots, each instrument module comprising:

a module housing for insertion into one of said slots;
a first circuit board mounted on said module housing having a computer processor, first memory means for storing first and second instructions for controlling the operation of said computer processor, a first computer bus interconnecting said first memory means and said computer processor, and bus interface means connected between said first computer bus and said system bus when said module housing is installed in one of said slots for enabling said computer processor and said computer to communicate with one another via said system bus and said first computer bus;

a second circuit board mounted on said module housing having a second computer bus similar to said first computer bus, second memory means for storing third instructions for controlling the operation of said computer processor, port means for receiving data from an external device and forwarding said external data for storage in said second memory means via said second computer bus; and manually operable connector means for interconnecting said first and second computer buses to form an integral computer bus between said computer processor, said first and second memory means, said bus interface means and said port means, wherein said first instructions stored in said first memory means cause said computer processor to commence executing said second instructions stored in said first memory means when said first and second computer buses are not interconnected and to otherwise commence executing said third instructions stored in said second memory means when said first and second computer buses are interconnected.

10. The instrument development system in accordance with claim 9 wherein said third instructions comprise a debugger routine enabling a user operating a terminal connected to said port means to load data comprising computer instructions into said second memory means and to cause said computer processor to execute and computer instructions.

11. For a computer-based modular instrument system of the type having a chassis with slots for receiving instrument modules and a timing and resource manager module including a host computer, a system bus connected to said slots for conveying data between the host computer and the instrument modules installed in the slots and for conveying first control signals between the instrument modules, each instrument module comprising:

a module housing for insertion into one of said slots;
a first circuit board mounted on said module housing having a computer processor, first memory means for storing first and second instructions for controlling the operation of said computer processor, a first computer bus interconnecting said first memory means and said computer processor, and first bus interface means connected between said first computer bus and said system bus when said module housing is installed in one of said slots for enabling said computer processor and said computer to communicate with one another via said system bus and said first computer bus;

a second circuit board mounted on the module housing having a second computer bus similar to said first computer bus, second memory means connected to said second computer bus for storing third instructions for controlling the operation of said computer processor, and means for placing a particular code on said computer bus in response to a particular address appearing on said second computer bus;

a third circuit board mounted on said module housing having a third computer bus similar to said first computer bus and a circuit for carrying out a specified operation in response to commands conveyed on said third computer bus; and manually operable connector means for interconnecting said first, second and third computer buses to form an integral computer bus between said computer processor, said first and second memory means, and said circuit.

12. The instrument module in accordance with claim 11 wherein said first instructions cause said computer to place said particular address on said first computer bus and to commence executing said second instructions when said particular code does not appear on said first computer bus in response to said particular address, and to execute said third instructions when said particular code does appear on said first computer bus in response to said particular address.

13. The instrument module in accordance with claim 11 wherein said third circuit board further comprises means interfacing said circuit to a portion of said system bus, said operation carried out by said circuit including communicating with other instrument modules through said portion of said system bus.

* * * * *